(12) United States Patent
Hohage et al.

(10) Patent No.: US 8,759,232 B2
(45) Date of Patent: Jun. 24, 2014

(54) COMPRESSIVE STRESS TRANSFER IN AN INTERLAYER DIELECTRIC OF A SEMICONDUCTOR DEVICE BY PROVIDING A BI-LAYER OF SUPERIOR ADHESION AND INTERNAL STRESS

(75) Inventors: Joerg Hohage, Dresden (DE); Hartmut Ruelke, Dresden (DE); Ralf Richter, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/588,460

(22) Filed: Aug. 17, 2012

(65) Prior Publication Data
US 2014/0048912 A1 Feb. 20, 2014

(51) Int. Cl.
*H01L 21/31* (2006.01)
*H01L 21/469* (2006.01)

(52) U.S. Cl.
USPC ...... 438/763; 257/E21.24; 438/703; 438/757; 438/758; 438/778; 438/791

(58) Field of Classification Search
USPC ............ 257/E21.24; 438/703, 757, 758, 763, 438/778, 791
See application file for complete search history.

(56) References Cited

U.S. PATENT DOCUMENTS

| 2007/0037388 A1* | 2/2007 | Hohage et al. ............... 438/675 |
| 2008/0146007 A1* | 6/2008 | Balseanu et al. ............. 438/483 |
| 2011/0169095 A1* | 7/2011 | Chen et al. .................... 257/369 |

* cited by examiner

*Primary Examiner* — Asok K Sarkar
(74) *Attorney, Agent, or Firm* — Amerson Law Firm, PLLC

(57) ABSTRACT

The present disclosure provides manufacturing techniques and semiconductor devices in which performance of P-channel transistors may be enhanced on the basis of a stress mechanism that involves the deposition of a dielectric bi-layer system. Contrary to conventional strategies, an additional pre-treatment may be performed prior to the deposition of an adhesion layer in a plasma-free process atmosphere, thereby enabling a reduced thickness of the adhesion layer and a higher internal stress level of the subsequent top layer.

19 Claims, 5 Drawing Sheets

COMPRESSIVE STRESS TRANSFER IN AN INTERLAYER DIELECTRIC OF A SEMICONDUCTOR DEVICE BY PROVIDING A BI-LAYER OF SUPERIOR ADHESION AND INTERNAL STRESS

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors and used for generating strain in channel regions of the transistors.

2. Description of the Related Art

Integrated circuits typically include a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed in and on a semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above, if a planar transistor architecture is considered, or generally adjacent to, if any other transistor architecture, such as a fin-type transistor or the like, is considered, the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel adjacent to the gate dielectric layer upon application of the control voltage to the gate electrode, the conductivity of the channel region substantially determines the performance of the transistors. For this reason and in view of generally increasing packing density of integrated circuits, the reduction of the channel length may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 3 Giga-Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for controlling the desired intrinsic stress.

In current CMOS logic technology, the dielectric layer stack formed above the basic transistors, therefore, typically consists of the contact etch stop layer having a thickness of several hundred Angstrom, which is frequently directly deposited on the exposed surface areas of the transistors, for instance after the silicidation process, which is frequently applied so as to enhance overall conductivity of drain and source areas and possibly of the gate electrode structure, depending on the process strategy used. Thereafter, an interlayer dielectric material, also referred to as pre-metal deposition layer, with a thickness of several thousand Angstrom is formed, frequently as a silicon oxide material, which may subsequently be patterned so as to receive respective contact openings which are then filled with an appropriate contact material, such as tungsten and the like. Upon applying the above-described technique, the etch stop layer is formed so as to induce tensile and/or compressive strain in the channel regions of the respective transistors in order to enhance transistor characteristics, i.e., drive current capability and the like. In this strain-inducing mechanism, performance improvement of the various transistors depends on the internal stress level of the etch stop layer and the thickness of this layer. Since generally the thickness of the etch stop layer is substantially determined by overall design rules, which demand a certain minimal pitch between neighboring gate electrode structures, there is an ongoing tendency to improve transistor characteristics by appropriately increasing the internal stress level of the etch stop layer. It appears, however, that simply increasing the internal stress level may not necessarily result in an increased strain level in the respective channel regions since the stress transfer mechanism strongly depends on the adhesion characteristics of the highly stressed dielectric material when formed on exposed surface areas of the transistors, as will be explained with reference to FIG. 1.

FIG. 1 schematically illustrates a cross-sectional view of a semiconductor device 100 comprising a substrate 101, such as a silicon substrate, or any other appropriate carrier material for forming thereon a semiconductor layer 102 in and above which transistors 150a, 150b are formed. Typically, the semiconductor layer 102 may represent a crystalline semiconductor material which may comprise a significant amount of silicon since silicon is presently a preferred base material for fabricating sophisticated CMOS devices in compliance with volume production techniques. As usual, the semiconductor layer 102 is typically laterally delineated in a plurality of active regions 102a wherein, for convenience, a single active region is shown in FIG. 1. Furthermore, any isolation structures for laterally delineating the active region 102a are not shown. In the example shown, the two transistors 150a, 150b are formed in and above the active region 102a, wherein it should be appreciated that a single transistor or more than two transistors may be formed in the active region 102a, depending on the overall requirements. For example, in densely packed device areas, such as memory areas and the like, a plurality of individual transistors may be formed in and above a single active region. The transistors 150a, 150b are illustrated as transistors having a planar transistor architecture in which drain and source regions 152 laterally delineate a channel region 151, which may be understood as a region with a substantially two-dimensional interface area with respect to a gate dielectric material 161 of gate electrode structures 160a, 160b, respectively, as is also discussed above. It should be appreciated that, in other transistor architectures, the channel region 151 may have corresponding interface areas that may represent different planes and may thus provide a three-dimensional transistor architecture, for instance as is known for fin-type transistors, also referred to as FinFET. Furthermore, the gate electrode structures 160a, 160b may comprise one or more electrode materials 162, 163 depending on the overall configuration. In this respect, it should be appreciated that the gate electrode structures 160a, 160b may represent complex structures including high-k dielectric materials in combination with appropriately selected electrode materials in order to increase the overall productivity of the electrode materials and also adjust an appropriate work function of the gate electrode structures 160a, 160b. In the example shown, the gate electrode structures 160a, 160b may comprise a semiconductor material, possibly in combination with appropriate metal-containing materials within the electrode material 162 and a metal silicide in the material 163, wherein, however, any other configuration may be used.

Moreover, typically, metal silicide regions 153 are formed within the drain and source regions 152 in order to reduce contact resistance and improve the series resistance of the transistors 150a, 150b. Furthermore, an etch stop layer 120 of high internal stress level is formed above the transistors 150a, 150b so as to induce a desired type of strain 151s in the channel regions 151. Since typically P-channel transistors suffer from a reduced charge carrier mobility compared to N-channel transistors, it is of great importance to appropriately increase, in particular, the compressive strain in the channel regions of P-channel transistors. Hence, in the example shown, the transistors 150a, 150b represent P-channel transistors in which the etch stop layer 120 is provided with high internal compressive stress so as to efficiently improve drive current capability and switching speed of the transistors 150a, 150b. Furthermore, as discussed above, a pre-metal deposition layer or an interlayer dielectric material 124 in the form of silicon dioxide and the like is typically formed above the etch stop layer 120.

The transistors 150a, 150b may be formed on the basis of any appropriate manufacturing strategy, for instance, forming the gate electrode structures 160a, 160b in accordance with the required design rules which, in sophisticated applications, may require a gate length of 40 nm and less, thereby necessitating the application of highly sophisticated patterning strategies. As discussed above, if required, sophisticated high-k metal gate electrode structures may be implemented. Thereafter, the drain and source regions 152 are typically formed by implantation, epitaxial growth techniques and the like, wherein typically a spacer structure 164 of the gate electrode structures 160a, 160b is used for appropriately defining the lateral profile of the drain and source regions 152. It should be appreciated that other strain-inducing mechanisms may be implemented, for instance, by incorporating a strain-inducing semiconductor material by applying stress memorization techniques and the like so as to further improve the overall transistor characteristics. After any high temperature processes, for instance for activating implanted dopants and the like, the metal silicide 153 is formed on the basis of well-established silicidation techniques, thereby completing the basic transistor configurations.

Thereafter, the etch stop layer 120 is formed so as to have a desired high internal stress level in order to induce the strain 151s. To this end, silicon nitride has proven to be a viable candidate for being deposited on the basis of well-established plasma enhanced chemical vapor deposition (CVD) techniques with high internal compressive stress if P-channel transistors are considered, while also providing the required etch stop capabilities. Consequently, a plurality of deposition recipes have been developed in order to control process parameters, such as gas flow rates, ion bombardment, pressure and the like, in order to deposit the silicon nitride material with high intrinsic compressive stress. Although internal stress levels of 3 GPa and even higher may be achieved, it turns out that the high internal stress level in the etch stop layer may not be transferred as efficiently into the channel region 151 as one would expect. One reason is seen in the adhesion characteristics of the silicon nitride material with respect to the exposed surface areas of the transistors 150a, 150b. For this reason, it has been proposed to provide the etch stop layer 120 in the form of a bi-layer including an adhesion layer 121, which has a significantly lower internal stress level and which is designed to provide superior adhesion to the transistor surface areas, while a subsequent layer 122 may provide the required high internal stress level. Consequently, typically two different deposition recipes are applied in forming the bi-layer 120 so as to obtain superior adhesion for the layer 121 and to obtain a very high internal stress level for the layer 122. In some cases, as indicated by the component 123, an additional etch stop layer, for instance in the form of a thin silicon dioxide material, may be provided, for instance if the layer 120 is to be patterned so as to provide etch stop layers of different stress characteristics above different transistor types. In other cases, the bi-layer 120 is directly formed on exposed surface areas of the transistors 150a, 150b.

Basically, the bi-layer 120 provides a very efficient strain-inducing mechanism wherein, in sophisticated applications, the adhesion layer may be provided with a thickness of approximately 10 nm with a stress level of 1.7-1.9 GPa, while the layer 122 may have a desired increased thickness with an internal stress level of 3 GPa and significantly higher, for instance up to 3.6 GPa. Since generally the mechanical force induced by the internal stress level of the layer 120 is simply determined by the internal stress level times the thickness of the layer 120, the average stress level is determined by the overall thickness and the combined stress levels of the layers 121 and 122. Hence, in order to increase the finally obtained strain 151s in the channel region 151, an increase in overall thickness and in the average stress level would be highly desirable which, however, is not compatible with the demand for ever increasing packing density in sophisticated semiconductor devices. That is, due to a reduced pitch of neighboring gate electrode structures, such as the structures 160a, 160b, the overall thickness of the bi-layer 120 has to be adapted so as to allow a reliable deposition of the stressed silicon nitride material in the spaces between these neighboring structures, thereby requiring a deposition thickness of approximately 40 nm for semiconductor devices including gate electrode structures having a gate length of approximately 40 nm and less.

This deposition recipe represents a sophisticated deposition technique for forming the bi-layer 120 so as to obtain a high desired compressive strain in the channel regions 151. The deposition may be performed in a process environment established on the basis of a deposition tool that is available from Applied Materials Inc. under the name Producer, which is appropriately configured to process semiconductor substrates of 300 mm in diameter. In a first step, the adhesion layer 121 is formed by first setting up the process chamber of the deposition tool, wherein the substrate 101 is positioned on an appropriate substrate holder that enables the adjustment of the temperature of the substrate to a desired value, which may be in the range of 300-550° C., for instance 480° C., while a spacing of the substrate 101 with respect to a shower head of the process chamber is adjusted to be in a range from 250-350 mil. Furthermore, a desired pressure is established by applying precursor gases in the form of silane and ammonia in combination with carrier gases in the form of nitrogen and argon.

Furthermore, in the next step of forming the adhesion layer 121, the actual deposition of the silicon nitride material is initiated by supplying low frequency power to the process atmosphere within the process chamber, thereby creating a plasma which in turn generates respective radicals that interact with exposed surface areas, as is well known in the art. During the deposition step, low frequency power of approximately 30-150 W may be applied, thereby obtaining a thickness of approximately 10 nm for a deposition time of 15 seconds.

Thereafter, two transition steps are performed so as to reconfigure the deposition atmosphere within the process chamber in order to enable the deposition of the top layer 122 with the desired high internal stress level. In the first step of the two transition steps, high frequency power is supplied to the process atmosphere, while, in the second transition step, additionally the argon flow rate may be increased in order to obtain increased ion bombardment during the deposition process. Thus, during the transition steps, a plasma atmosphere is maintained in order to prepare the conditions for the subsequent deposition of the layer 122. In the next step, the previously adjusted process conditions are maintained for a time of 72-110 seconds, thereby obtaining a thickness of approximately 30 nm for the layer 122. Thereafter, the deposition process is terminated by applying purge and pump steps.

In Table 1 below there are listed respective parameter values that may be used in the above-described process sequence for forming the bi-layer 120.

TABLE 1

Formation of adhesion-layer 121

Set-up 15 sec:

T = 480° C. (300-550° C.), p = 1.5-2.5 Torr,
Spacing = 250-350 mils,
$SiH_4$ = 40-120 sccm, $NH_3$ = 50-200 sccm,
$N_2$ = 1000-3000 sccm, Ar = 1500-3000 sccm,
Deposition 15 sec (100 Å):

T = 480° C. (300-550° C.), p = 1.5-2.5 Torr,
Spacing = 250-350 mils, LF power = 30-150 Watts,
$SiH_4$ = 40-120 sccm, $NH_3$ = 50-200 sccm,
$N_2$ = 1000-3000 sccm, Ar = 1500-3000 sccm,
Transition steps
Transition step1:

Pre1 1 sec, T = 480° C. (300-550° C.), p = 1.5-2.5 Torr,
Spacing = 250-350 mils, LF power = 20-120 W, HF power = 60-160 W,
$SiH_4$ = 40-120 sccm, $NH_3$ = 50-200 sccm,
$N_2$ = 1000-3000 sccm, Ar = 1500-3000 sccm,
Transition step4:

Pre2 1 sec, T = 480° C. (300-550° C.), p = 1.5-2.5 Torr,
Spacing = 250-350 mils, LF power = 20-120 W, HF power = 60-160 W,
$SiH_4$ = 40-120 sccm, $NH_3$ = 50-200 sccm,
$N_2$ = 1000-2000 sccm, Ar = 2000-5000 sccm,
Formation of high stress top layer 122
Deposition 70-110 sec (300 Å):

T = 480° C. (300-550° C.), p = 1.5-2.5 Torr,
Spacing = 250-350 mils, LF power = 20-130 W, HF power = 60-160 W,
$SiH_4$ = 40-120 sccm, $NH_3$ = 50-200 sccm,
Ar = 2000-5000 sccm, $H_2$ = 2000-5000 sccm,
Purge & Pump
Purge 10 sec:

T = 480° C. (300-550° C.), p = 1.5-2.5 Torr,
Spacing = 250-350 mils, LF power = 0 W, HF power = 0 W,
$SiH_4$ = 0 sccm, $NH_3$ = 0 sccm, Ar = 2000-5000 sccm, $H_2$ = 0 sccm,
Pump 10 sec:

T = 480° C. (300-550° C.), TV open,
Spacing = Lift position, LF power = 0 W, HF power = 0 W,
$SiH_4$ = −1, $NH_3$ = −1, Ar = −1, $H_2$ = −1, By using the above-specified deposition recipe, the internal stress levels as indicated above may be obtained. However, the resulting strain level in the channel regions is less than expected and a further improvement of the characteristics of P-channel transistors is highly desirable. It turns out, however, that simply reducing the thickness of the adhesion layer 121 and increasing the thickness of the top layer 122 by the same amount has actually not resulted in higher forces and improved performance of the P-channel transistors since a loss of adhesion may be accompanied by reducing the thickness of the adhesion layer 121.

In view of the situation described above, the present disclosure relates to process techniques and semiconductor devices in which an efficient strain-inducing mechanism may be provided on the basis of a highly stressed dielectric material, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to process techniques and resulting semiconductor devices in which the strain level in the channel region of P-channel transistors may be improved by increasing the force acting on the channel region. To this end, it has been recognized that, in particular, an adhesion layer of superior adhesion may significantly influence the overall stress transfer efficiency, for instance, since an improved adhesion may enable a reduction of the thickness of the adhesion layer in a bi-layer system, while also a certain increase of the internal stress level of the adhesion layer may contribute to an increased overall force that may act on the P-channel transistor. Furthermore, based on a superior adhesion, a desired high stress level may be applied in the top layer, which may be provided with increased thickness for a given total thickness of the bi-layer system due to the reduction in thickness of the adhesion layer. Moreover, in some illustrative embodiments, even an increased internal stress level may be achieved in the top layer, thereby even further contributing to an increased overall stress level of the bi-layer system.

One illustrative method disclosed herein comprises exposing surface areas of a transistor of a semiconductor device to a plasma-free ammonia and nitrogen-containing atmosphere so as to prepare the surface areas for deposition of a first strain-inducing material layer. The method further comprises forming the first strain-inducing material layer on the surface areas by using a first plasma assisted deposition process, wherein the first strain-inducing material layer induces a compressive strain in a channel region of the transistor and wherein the first strain-inducing material layer has a first internal stress level. The method further comprises forming a second strain-inducing material layer on the first strain-inducing material layer by using a second plasma assisted deposition process, wherein the first plasma assisted deposition process differs from the second plasma assisted deposition process by at least one process parameter setting. Furthermore, the second strain-inducing material layer induces a compressive strain in the channel region and has a second internal stress level that is higher than the first internal stress level.

A further illustrative method disclosed herein relates to forming a compressive bi-layer above a transistor. The method comprises removing oxygen-containing contaminants from a surface area above the transistor by establishing a chemically reactive atmosphere without supplying ionizing power to the chemically reactive atmosphere. The method further comprises forming a first strain-inducing material layer on the surface area by establishing a first plasma atmosphere, wherein the first strain-inducing material layer has a first internal stress level and a first thickness. The method additionally comprises forming a second strain-inducing material layer on the first strain-inducing material layer by establishing a second plasma atmosphere, wherein the second plasma atmosphere differs from the first plasma atmosphere with respect to at least one process parameter. Furthermore, the second strain-inducing material layer has a second internal stress level and a second thickness, wherein the second internal stress level is higher than the first internal stress level and wherein the second thickness is greater than the first thickness.

One illustrative semiconductor device comprises a first strain-inducing material layer formed above a P-channel transistor, wherein the first strain-inducing material layer has a first thickness and a first internal stress level of 2.2-2.5 GPa so as to induce a compressive strain in a channel region of the transistor. The semiconductor device further comprises a second strain-inducing material layer formed on the first strain-inducing material layer above the transistor, wherein the second strain-inducing material layer has a second thickness and a second internal stress level of 3.0 GPa and higher, wherein the first thickness is less than the second thickness.

It should be appreciated that, in the context of the present application, a plasma-free atmosphere is to be considered as a process atmosphere in which the supply of energy is suppressed, which would result in an intentional ionization of molecules. It should be appreciated, however, that, in the plasma-free atmosphere, nevertheless ionized particles may be present in an amount that complies with the degree of impact ionization caused by the thermal movement molecules under given thermal dynamic conditions and caused by any natural radiation that is typically present in a process environment for forming semiconductor devices. Similarly, the term "establishing a chemically reactive atmosphere without supplying ionizing power" is to be understood such that the supply of additional power intended for ionizing particles in the atmosphere is suppressed while still unavoidable high energetic radiation and particles as well as thermal movement may contribute to a certain but low degree of ionization in the process gases under consideration.

BRIEF DESCRIPTION OF THE DRAWINGS

The disclosure may be understood by reference to the following description taken in conjunction with the accompanying drawings, in which like reference numerals identify like elements, and in which.

Figure 1:
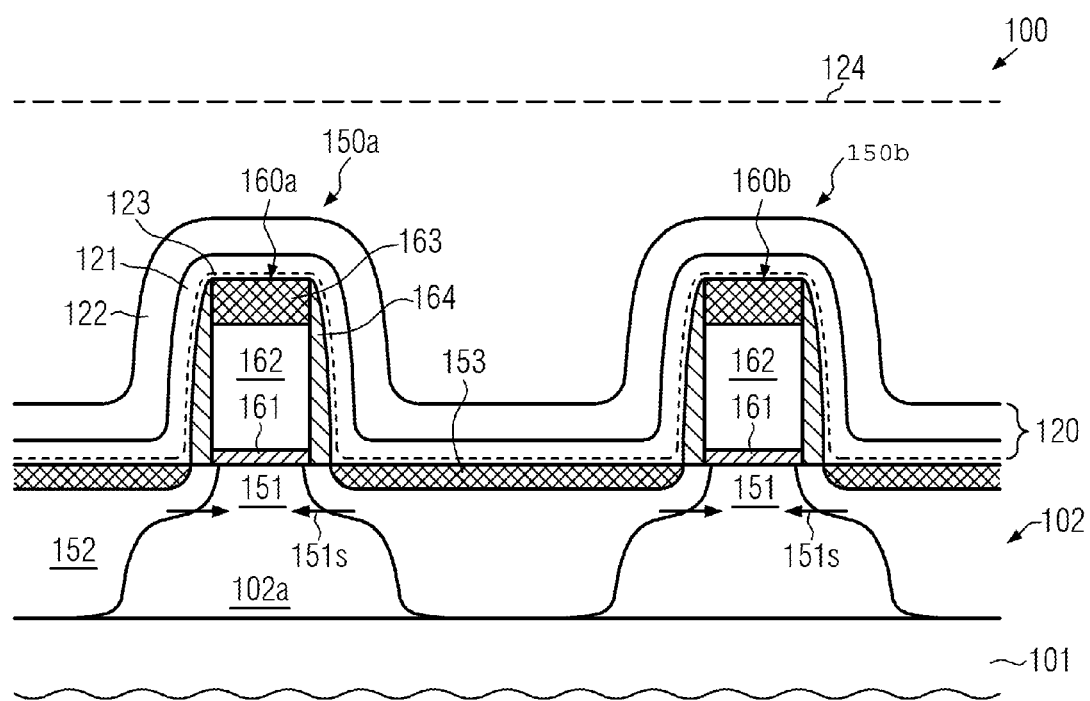
FIG. 1 schematically illustrates a cross-sectional view of a sophisticated semiconductor device with a bi-layer formed on the basis of a conventional deposition recipe.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the present disclosure, it has been recognized that high intrinsic stress levels alone are not sufficient for improving performance of a P-channel transistor. In particular, when using the concept of a dielectric bi-layer system with superior internal stress level, it has been recognized that improving the adhesion is an important aspect for obtaining superior forces on the P-channel transistor for a given geometric configuration, i.e., overall thickness of the bi-layer. Thereafter, according to illustrative embodiments, an appropriately designed surface treatment or a pre-treatment is applied, which results in an interaction with a specifically designed process atmosphere with exposed surface areas, wherein the surface treatment may be performed on the basis of a plasma-free atmosphere, for instance on the basis of an ammonia and nitrogen-containing atmosphere, in order to clean exposed surface areas by removing oxygen contaminants. The plasma-free treatment, therefore, generates a strong interface with respect to the adhesion layer in order to transfer the high mechanical force obtained by the adhesion layer and the subsequent strongly stressed top layer to the underlying surface areas and thus finally into the channel region of the transistor under consideration. For example, the P-channel transistor may comprise drain and source regions including a metal silicide, wherein the characteristics of these sensitive areas is substantially not affected by the previous treatment due to the absence of a plasma. Hence, the electrical characteristics of these sensitive areas may be substantially preserved, while still the stress transfer into the channel region via these regions may be enhanced due to the superior adhesion characteristics achieved by the preceding treatment.

Furthermore, in some illustrative embodiments, the superior surface characteristics may enable the deposition of the adhesion layer with increased internal stress which may, for instance, be accomplished by establishing the respective plasma atmosphere on the basis of low frequency power and high frequency power. For example, in some illustrative embodiments, the ratio of high frequency power to low frequency power is in the range of 1.5-2.5, thereby obtaining increased ion bombardment, while other process parameters, such as gas flow rates of precursor gases and barrier gases, spacing between the substrate and the shower head and the like, may be appropriately adjusted so as to obtain increased internal stress and good uniformity of the layer thickness across the entire substrate. In this manner, in some illustrative embodiments, an internal stress level of the adhesion layer of 2.2-2.5 GPa is achieved, which is approximately 25-35% higher compared to conventional adhesion layers.

Due to the superior adhesion, the thickness of the adhesion layer may be reduced according to the principles disclosed herein, thereby even enabling a thickness reduction of approximately 50% compared to the thickness of a conventional adhesion layer substantially without loss of transfer of mechanical force into the underlying transistor areas.

In some illustrative embodiments, the plasma atmosphere for depositing the adhesion layer and the plasma atmosphere for depositing the top layer of high stress may be separated on the basis of an appropriate transition phase, however, without interrupting the plasma, wherein, in some illustrative embodiments, an additional transition step may be applied so as to even further improve the interface characteristics between the adhesion layer and the top layer.

In further illustrative embodiments, the internal stress level of the top layer may be increased up to 3.8 GPa, which may be approximately 5% higher than the internal stress level of conventional top layers, which may be achieved by increasing the pressure in the process atmosphere and the amount of gas for inducing ion bombardment and increasing the amount of plasma dilution gas.

In some illustrative embodiments, the surface treatment prior to the deposition of the adhesion layer may be efficiently combined with an increased internal stress level and/or a reduced thickness of the adhesion layer and with an increased internal stress level of the top layer so as to obtain an even further enhanced transistor performance of P-channel transistors due to the fact that the mechanical interface properties are significantly improved, thereby enabling an efficient transfer of the internal stress level to the underlying transistor areas. Furthermore, the interface characteristics between the adhesion layer and the top layer may also be influenced by an appropriate transition, i.e., the change of high frequency/low frequency power and gas flow rates between the two deposition steps, so that an increased internal stress level of the top layer may also be efficiently transferred to the transistor areas via the adhesion layer.

With reference to FIGS. 2a-2d, further illustrative embodiments will now be described in more detail, wherein reference may also be made to FIG. 1, if appropriate.

Figure 2A:
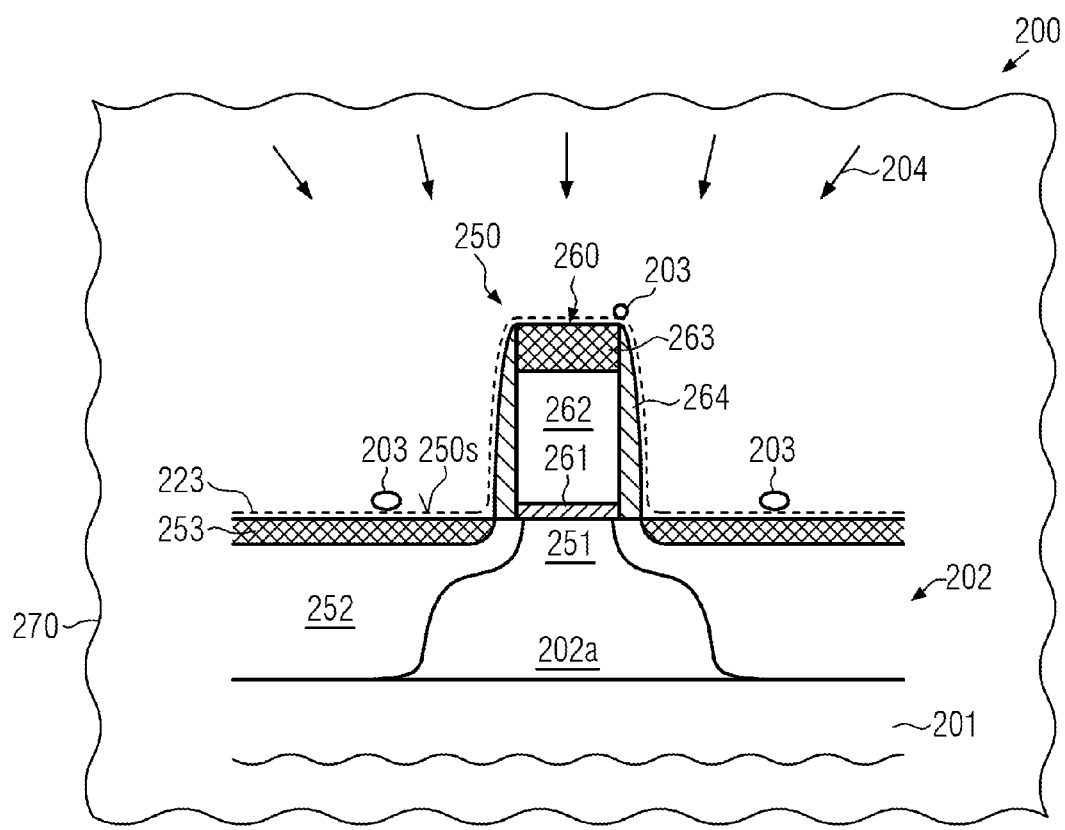
FIGS. 2a-2d schematically illustrate cross-sectional views of a semiconductor device during various manufacturing stages in forming a bi-layer system with superior internal stress level, according to illustrative embodiments.

FIG. 2a schematically illustrates a cross-sectional view of a semiconductor device 200 which may be processed in a process environment 270, which may be represented by a process chamber of a deposition tool and the like. The semiconductor device 200 may comprise, in this manufacturing stage, a substrate 201 having formed thereon a semiconductor layer 202. The semiconductor layer 202 may represent any appropriate semiconductor material which may comprise a significant amount of silicon, as described above with reference to the device 100. It should be appreciated, however, that other components, such as germanium, carbon or other semiconductor alloys and the like, may also be present in the semiconductor layer 202. Furthermore, it should be appreciated that the semiconductor layer 202 may be provided in a substantially crystalline form in sophisticated applications since, in these cases, superior drive current capability and thus switching speed may be achieved. In other cases, the principles disclosed herein may also be applied to amorphous semiconductor materials. Furthermore, at least some portions of the semiconductor layer 202 may be provided in the form of metal-containing materials, such as a metal silicide, which may thus be provided in a substantially non-crystalline state, depending on the overall process and device requirements. Furthermore, as discussed above, the semiconductor layer 202 may be divided into a plurality of active regions wherein, for convenience, a single active region 202a is illustrated in FIG. 2a. It should further be appreciated that a buried insulating material (not shown) may be formed below the semiconductor layer 202 if a silicon-oninsulator (SOI) configuration is considered.

A transistor 250 is formed in and above the active region 202a and comprises a gate electrode structure 260, which in turn includes a gate dielectric layer 261, one or more electrode materials 262, 263 and a spacer structure 264. It should be appreciated that the gate electrode structure 260 may have any appropriate configuration, for instance with respect to the implementation of high-k dielectric materials, metal-containing electrode materials and the like. Furthermore, a length of the gate electrode structure 260, i.e., a horizontal extension of the electrode material 262 at the gate dielectric layer 261, may be 40 nm and less in sophisticated applications, while other dimensions may be implemented in accordance with the design requirements for the device under consideration. Furthermore, the transistor 250 may comprise drain and source regions 252, which may be connected by a channel region 251, wherein, as is also discussed above with reference to the device 100, a planar transistor architecture is illustrated in FIG. 2a, while it should be appreciated that the principles disclosed herein may also be applied to any other transistor architecture, such as FinFET devices and the like. Furthermore, in some cases, a metal silicide 253 may be formed in the drain and source regions 252. Furthermore, in some instances, a think etch stop layer 223, such as a silicon dioxide material and the like, may be provided so as to enhance the further processing, for instance with respect to patterning a dielectric bi-layer when bi-layers of different internal stress levels have to be provided above transistors of a different type. In other cases, the etch stop liner 223 may be omitted.

The transistor 250, which represents a P-channel transistor, may be formed on the basis of any appropriate process strategy, as for instance also discussed above with reference to the device 100. Consequently, after performing any high temperature processes and completing the metal silicide regions 253, possibly in combination with a metal silicide in the regions 263, the further processing may be continued by forming the etch stop liner 223, if required. In other cases, the liner 223 may be omitted so as to enable a direct deposition of a bi-layer system on exposed surface areas of the transistor 250. It should be appreciated that typically oxygen-related contaminants, indicated as 203, may adhere to exposed surface areas 250s, for instance on surface areas of the gate electrode structure 260 and the drain and source regions 252 if the etch stop liner 223 is not provided, while in other cases these contaminants 203 may adhere to the surface of the liner 223. It should be appreciated that the exposed surface areas, indicated as 250s, may thus represent a surface of the liner 223, if provided, while in other cases the areas 250s may represent any exposed surface regions of the drain and source regions 252, for instance in the form of the metal silicide 253, and may also represent any exposed areas of the gate electrode structure 260.

According to the principles disclosed herein, it has been recognized that the surface characteristics of the areas 250s may be significantly improved by removing at least some of the oxygen-related contaminants 203 on the basis of a plasma-free process atmosphere 204, which may be established on the basis of ammonia ($NH_3$) and nitrogen gas ($N_2$). To this end, in one illustrative embodiment, the temperature of the device 200 may be adjusted to be in a range of between 300-550° C., for instance using a value of approximately 480° C. Moreover, in some illustrative embodiments, a pressure of the atmosphere 204 is controlled so as to be in a range from 1.8-3.0 Torr, for instance using a value of 2.5 Torr. Moreover, in order to maintain the atmosphere 204, a flow rate ratio of ammonia to nitrogen may be adjusted so as to be in a range from 2/35-1.0. Moreover, argon may be supplied to the process environment 270 in order to establish the atmosphere 204, wherein a flow rate ratio of argon with respect to the nitrogen gas may be controlled to be in a range from 10/35-3.5.

The following Table 2 provides process parameter values which may be used for establishing the process atmosphere 204 on the basis of the deposition tool with the tradename Producer available from Applied Materials Inc. when equipped so as to enable the processing of 300 mm diameter substrates.

TABLE 2

| Treatment based on process atmosphere 204 |
|---|
| Duration: 20-60 sec, |
| T = 480° C. (300-550° C.), |
| p = 2.5 Torr (1.8-3.0 Torr), |
| Spacing = 350 mils (250-450 mils), |
| $NH_3$ = 600 sccm (200-1000 sccm), |
| $N_2$ = 2500 sccm (1000-3500 sccm), |
| Ar = 2500 sccm (1000-3500 sccm). |

Figure 2B:
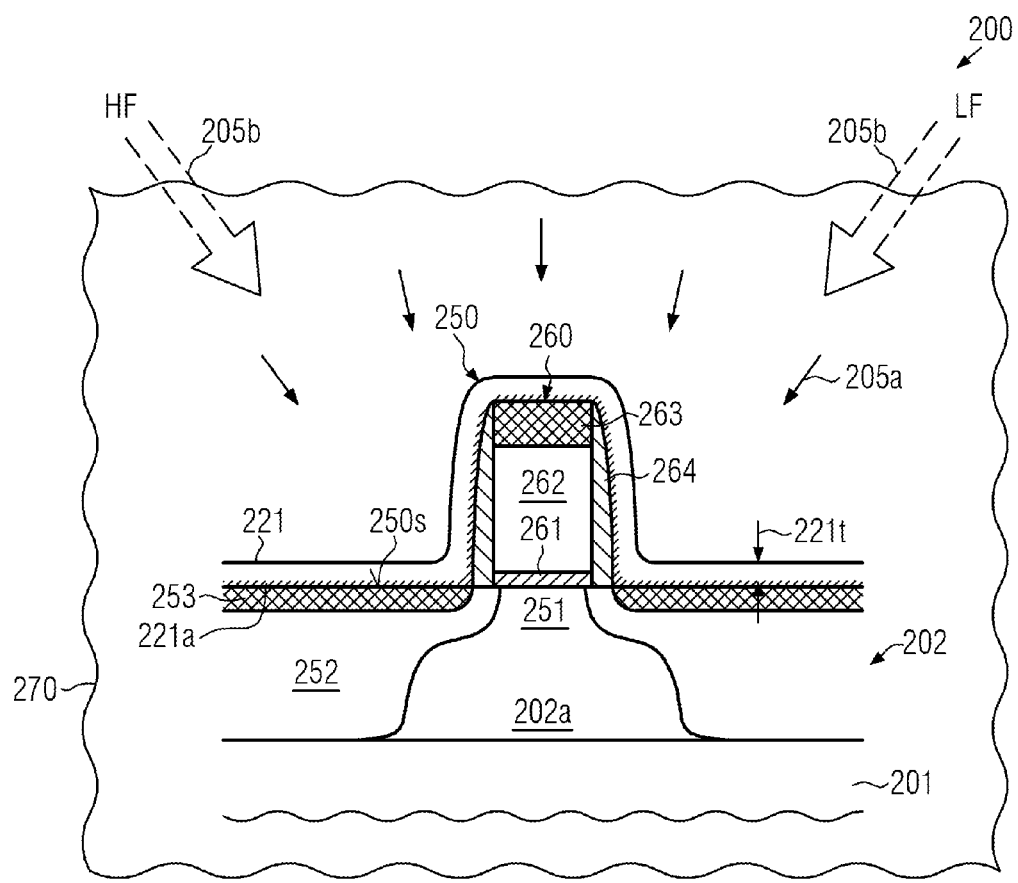

FIG. 2b schematically illustrates the device 200 in a further advanced stage in which an adhesion layer 221 of superior adhesion may be formed above the transistor 250 within an appropriate process environment, which, in the embodiment shown, is the same process environment 270 as used in the previous manufacturing phase. In a first step 205a of the formation of the adhesion layer 221, a process atmosphere, which is also indicated by the same reference number 205a, may be established so as to prepare the device 200 for the subsequent deposition of a silicon nitride-based material. For example, silane ($SIH_4$) and ammonia may be supplied to the process environment 270, however, without generating a plasma within the environment 270. Furthermore, nitrogen gas and argon gas may be supplied with appropriate flow rates, which may also be maintained during a subsequent deposition step 205b so as to obtain stable conditions during the deposition step 205b. In this first step 205a of the formation of the adhesion layer 221 of establishing a process atmosphere so as to prepare the device 200 for the subsequent deposition of the silicon nitrite based material, the supply of argon is optional. Argon is not necessary for a pretreatment of the device for the subsequent deposition. Instead, argon may be first introduced into the process atmosphere during the actual deposition step 205b.

During the actual deposition, a plasma is generated in the environment 270 by supplying low frequency power and high frequency power, wherein low frequency power is to be understood as electromagnetic power supplied with a frequency in the range of several Hz to several hundred KHz, while high frequency power is to be understood as electromagnetic power supplied at a frequency in the range of several mHz to several hundred mHz, depending on the capabilities of the process environment 270. Consequently, contrary to the conventional deposition recipe for an adhesion layer, also high frequency power is supplied to the environment 270 in order to increase ion bombardment and thus obtain an increased internal stress level in the layer 221. Due to the efficient surface treatment 204 (FIG. 2a), the resulting interface 221a formed by the layer 221 with the underlying surface areas 250s, a loss of adhesion may be avoided compared to the conventional approach, thereby allowing higher internal stress levels and a reduced thickness 221t of the layer 221, wherein a corresponding reduction in thickness may be adjusted up to approximately 50 percent of a conventional adhesion layer. For example, the thickness 221t may be selected to be approximately 50 nm, wherein it should be appreciated, however, that any other value may be selected in accordance with the overall process and device requirements.

Table 3 describes typical process conditions and parameters for forming the adhesion layer 221 on the basis of the process steps 205a and 205b, wherein the corresponding process parameter values relate to the above-indicated deposition tool.

TABLE 3

Forming adhesion layer 221

Step205a:

Set-up $SiH_4$ 10 sec (5-15 sec),
T = 480° C. (300-550° C.),
p = 2.5 Torr (1.8-3.0 Torr),
Spacing = 350 mils (250-450 mils),
$SiH_4$ = 45 sccm (20-60 sccm),
$NH_3$ = 30 sccm (0-100 sccm),
$N_2$ = 2500 sccm (1000-3500 sccm),
Ar = 2500 sccm (1000-3500 sccm).

Step 205b:

Deposition 5 sec/50 Å (4-10 sec/40-100 Å),
T = 480° C. (300-550° C.),
p = 2.5 Torr (1.8-3.0 Torr),
Spacing = 350 mils (250-450 mils),
LF power = 200 W (130-280 W),
HF power = 80 W (50-150 W),
$SiH_4$ = 45 sccm (20-60 sccm),
$NH_3$ = 30 sccm (0-100 sccm),
$N_2$ = 2500 sccm (1000-3500 sccm),
Ar = 2500 sccm (1000-3500 sccm).

Figure 2C:
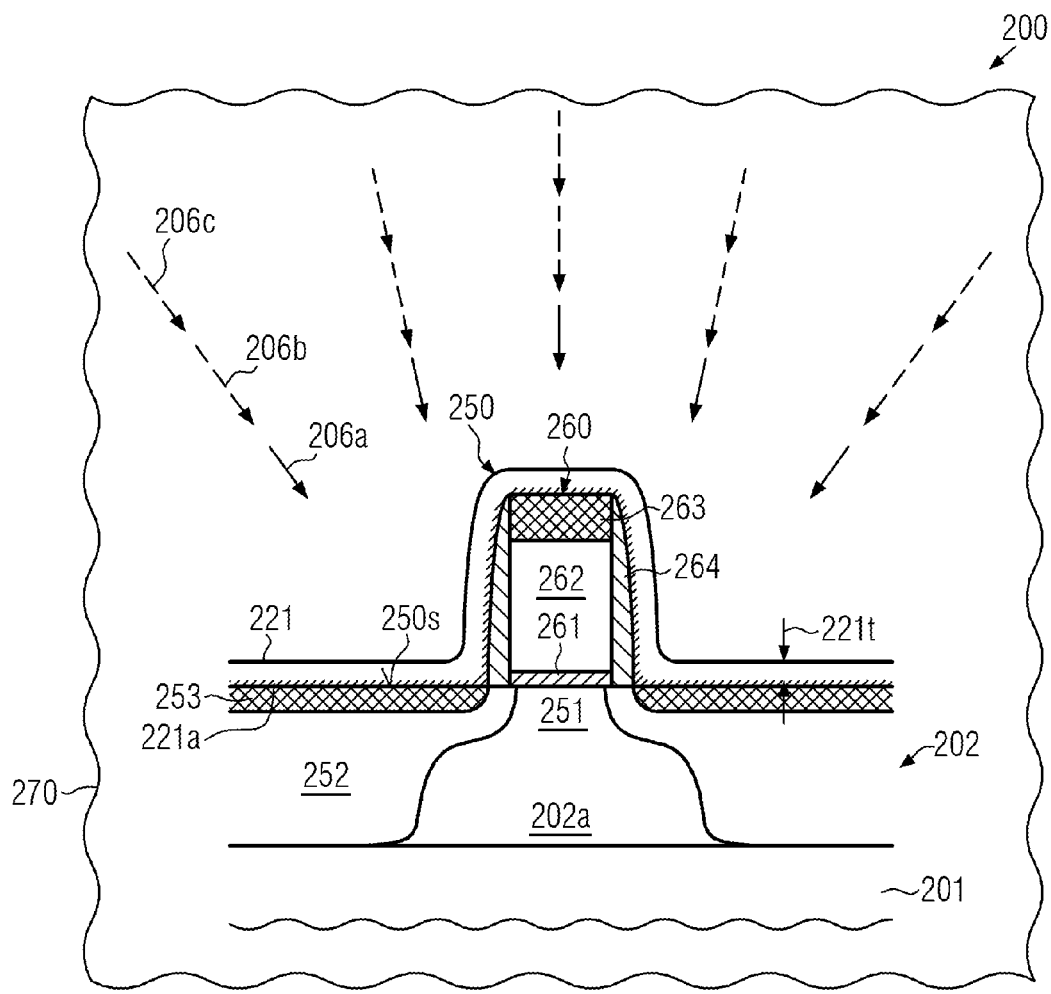

FIG. 2c schematically illustrates the device 200 in a further advanced stage in which an appropriate transition phase is implemented after the deposition of the adhesion layer 221 and prior to the deposition of a highly stressed top layer. In the embodiment shown, the transition phase may be established in the same process chamber 270 so as to enable a continuous presence of a plasma atmosphere. In one illustrative embodiment, the transition phase may be implemented on the basis of three subsequent transition steps 206a, 206b and 206c. For example, during the first step 206a, appropriate gas flow rates may be adjusted in combination with appropriate values of a low frequency power and the high frequency power, followed by step 206b in which the respective power values are set to the values as may also be used during an actual deposition step. Moreover, during the steps 206a, 206b, the supply of the carrier gases nitrogen and argon may be appropriately reduced and increased, respectively, so that, in the final transition step 206c, stable conditions with respect to an increased desired argon flow rate may be established, while the flow rate of nitrogen may be discontinued. Furthermore, an appropriate high amount of dilution gas hydrogen may be supplied during the last transition step 206c. In this manner, an appropriate process atmosphere may be established so as to enable the deposition of a silicon nitride material with very high internal stress.

Table 4 illustrates respective parameter values and process times for the transition steps 206a, 206b, 206c when using the above-identified deposition process tools.

TABLE 4

Transition steps after forming adhesion layer 221 and prior to forming top layer 222

Step 206a:

Pre1 1 sec (0.5-3 sec),
480° C. (300-550° C.),
p = 2.5 Torr (1.8-3.0 Torr),
Spacing = 350 mils (290-450 mils),
LF power = 50 Watts,
HF power = 75 Watts,
$SiH_4$ = 45 sccm (20-80 sccm),
$NH_3$ = 30 sccm (0-100 sccm),
$N_2$ = 2600 sccm (1000-3500 sccm),
Ar = 2500 sccm (1000-3500 sccm).

Step 206b:

Pre2 1 sec (0.5-3 sec),
480° C. (300-550° C.),
p = 2.5 Torr (1.8-3.0 Torr),
Spacing = 350 mils (290-450 mils),
LF power = 40 W (20-100 W),
HF power = 120 W (60-160 W),
$SiH_4$ = 50 sccm (30-90 sccm),
$NH_3$ = 140 sccm (70-200 sccm),
$N_2$ = 1500 sccm (500-2500 sccm),
Ar = 3500 sccm (2000-5000 sccm).

Step 206c:

Pre3 2 sec (0.5-4 sec),
480° C. (300-550° C.),
p = 2.5 Torr (1.8-3.0 Torr),
Spacing = 350 mils (290-450 mils),
LF power = 40 W (20-100 W),
HF power = 120 W (60-160 W),
$SiH_4$ = 50 sccm (30-90 sccm),
$NH_3$ = 140 sccm (70-200 sccm),
Ar = 3500 sccm (2000-4000 sccm),
$H_2$ = 4500 sccm (2500-4500 sccm).

Figure 2D:
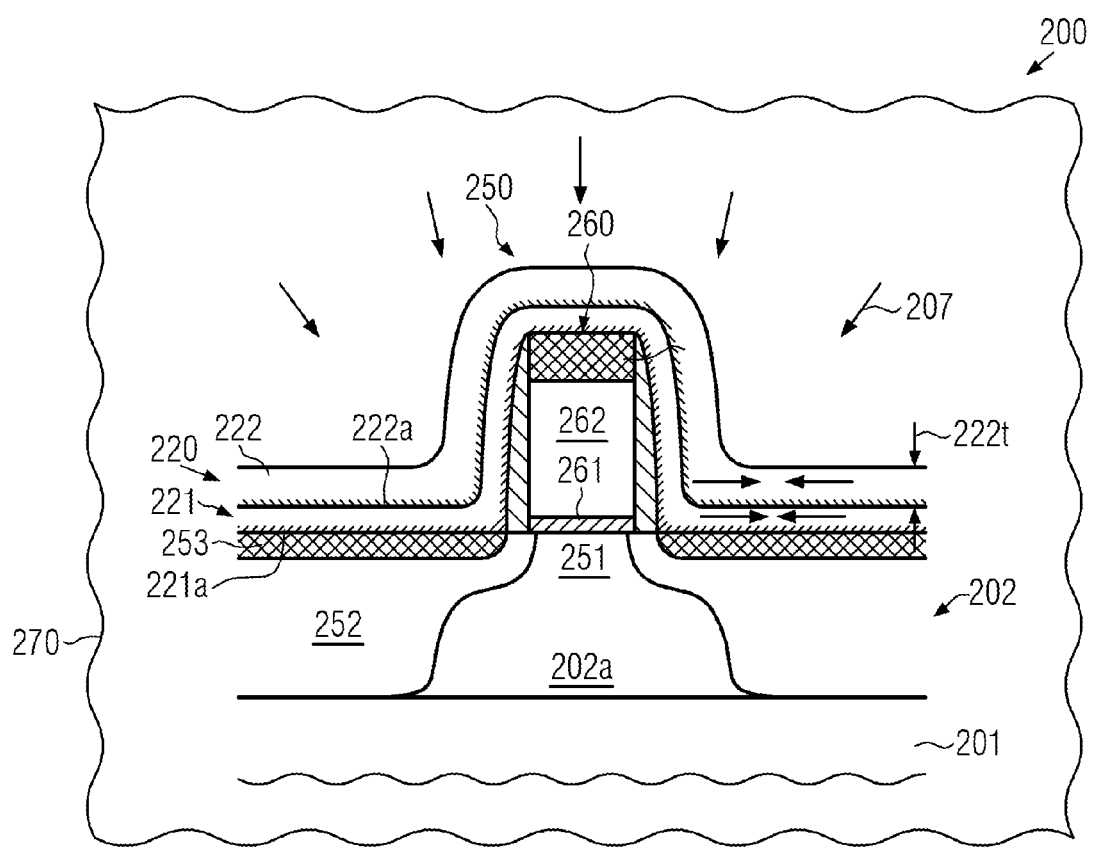

FIG. 2d schematically illustrates the semiconductor device 200 in the process environment 270 when performing the deposition process 207 based on an appropriate deposition atmosphere. During the process 207, a top layer 222 may be formed with a desired thickness 222t, which is significantly greater than the thickness of the adhesion layer 221, as already discussed above. Furthermore, the internal stress level of the top layer 222 may be adjusted so as to obtain a moderately high internal stress level of 3 GPa and higher, for example achieving an internal compressive stress level of up to 3.8 GPa, thereby improving the internal stress level of conventional top layers by approximately 5%. To this end, a moderately high concentration of argon and hydrogen gases as gases for ion bombardment and plasma dilution may be used in combination with appropriately selected gas flow rates of the precursor gases silane and ammonia. Furthermore, the high frequency power level and the low frequency power level may be selected so as to obtain the desired internal stress level. Similarly, the pressure is appropriately selected and may be higher compared to conventional deposition recipes.

Table 5 illustrates respective process times and parameter values for forming the layer 222 with a thickness of approximately 30 nm when using the above-identified process tool. It should be appreciated that the thickness of the top layer 222 may be increased, for instance, by increasing the overall deposition time, so as to obtain a thickness of approximately 35 nm, thereby obtaining in total a thickness of 40 nm of the bi-layer 220 which may thus have the same total thickness as the conventional bi-layer, as discussed above with reference to FIG. 1, while the average internal stress level may be higher, thereby imparting increased strain to the channel region of the transistor 250, as is already discussed above. Moreover, due to the previously performed transition steps 260a, 260b, 260c (FIG. 2c), an interface 222a formed between the top layer 222 and the adhesion layer 221 also exhibits superior adhesion characteristics, thereby allowing a highly efficient stress transfer from the top layer 222 into the adhesion layer 221 and finally into the channel region 251.

TABLE 5

Deposition process 207 for forming top layer 222

Deposition 80-120 sec (300 Å),
480° C. (300-550° C.),
p = 2.5 Torr (1.8-3.0 Torr),
Spacing = 350 mils (290-450 mils),
LF power = 40 W (20-100 W),
HF power = 120 W (70-200 W),
$SiH_4$ = 50 sccm (30-90 sccm),
$NH_3$ = 140 sccm (70-200 sccm),
Ar = 4500 sccm (3000-7000 sccm),
$H_2$ = 5500 sccm (3000-7000 sccm).

After the deposition process 207, the further processing may be continued by performing purge and pump steps, as for instance also applied in the conventional process recipes, wherein Table 6 illustrates corresponding process parameters and process times which may be appropriate for being used in combination with the above-identified deposition tool.

TABLE 6

Purge & Pump

Purge 10 sec,

480° C. (300-550° C.),
p = 2.3 Torr (1.8-2.8 Torr),
Spacing = 350 mils (290-450 mils),
LF power = 0 W,
HF power = 0 W,
$SiH_4$ = 0 sccm,
$NH_3$ = 0 sccm (10-200 sccm),
Ar = 4500 sccm (2000-6000 sccm),
$H_2$ = 0 sccm (0-3000 sccm),
Pump 10 sec, 480° C. (300-550° C.),
TV open,
Spacing = Lift position,
LF power = 0 Watts,
HF power = 0 Watts,
$SiH_4$ = −1, $NH_3$ = −1, Ar = −1, $H_2$ = −1.

It should be appreciated that the above-given values for the various process parameters are highly efficient for a 300 mm deposition tool, i.e., the Producer system available from Applied Materials Inc., wherein these parameter values may be appropriately scaled such that the process sequence described above is also applicable for other substrate sizes and process chamber geometries. For example, for a 200 mm configuration of the Producer system, the gas flows and the RF power may be reduced by a factor of about 0.5 in most cases. Other process parameters, such as spacing, pressure, temperature, may not need to be changed in most cases.

Furthermore, the deposition time and the process times for the various transition steps are given for a 35 nm bi-layer. Since thickness is dependent on the technology node under consideration, the total thickness of the adhesion layer 221 and the top layer 222 is typically selected to be in a range between 30-100 nm, wherein the significant contribution to an adaptation of the total layer thickness may come from a variation of the thickness of the top layer. On the other hand, the thickness and thus the corresponding deposition time of the adhesion layer may be adjusted in a significantly lesser degree to obtain optimized stress transfer depending on the transistor geometry under consideration. That is, to the superior adhesion characteristics of the adhesion layer 221, a generally significantly reduced thickness thereof compared to a standard adhesion layer may be sufficient to ensure appropriate stress transfer from the top layer to the underlying transistor areas with only a light adaptation of the thickness of the adhesion layer being necessary for adaptation to specific device requirements.

As a result, the present disclosure provides manufacturing techniques and semiconductor devices in which superior stress transfer from a bi-layer system into the channel region of a P-channel transistor may be obtained. To this end, the transition between a top layer and underlying transistor areas may be improved by applying an additional plasma-free surface treatment prior to depositing the adhesion layer which, in some illustrative embodiments, may be provided with reduced thickness and higher internal stress level compared to standard process recipes. Similarly, by appropriately designing the transition between the deposition process for forming the adhesion layer and the deposition process for forming the top layer, superior adhesion may be obtained, thereby allowing application of high internal stress in the top layer. For example, in a 28 nm technology node, the drive current of P-channel transistors may be increased by approximately 5% upon using the concept of an improved bi-layer system based on an additional surface pre-treatment.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
exposing surface areas of a transistor of a semiconductor device to a plasma-free ammonia (NH3) and nitrogen (N2) containing atmosphere so as to prepare said surface areas for deposition of a first strain-inducing material layer;
forming said first strain-inducing material layer on said surface areas using a first plasma assisted deposition process said first strain-inducing material layer inducing a compressive strain in a channel region of said transistor and having a first internal stress level;
wherein the first plasma assisted deposition process comprises:
(a) providing an initial process atmosphere comprising an initial flow rate of carrier gas of zero or higher at a low frequency power of from 30-150 W for a deposition time of about 15 seconds, and,
(b) performing:
(i) a first transition step comprising supplying a high frequency power of from about 60-160 W, the ratio of high frequency power to low frequency power being in the range of 1.5-2.5, and (ii) a second transition step comprising increasing the flow rate of carrier gas while maintaining said high frequency power for a time of 72-110 seconds; and forming a second strain-inducing material layer on said first strain-inducing material layer by using a second plasma assisted deposition process, said first plasma assisted deposition process differing from said second plasma assisted deposition process by at least one process parameter setting, said second strain-inducing material layer inducing a compressive strain in said channel region and having a second internal stress level that is higher than said first internal stress level.

2. The method of claim 1, further comprising maintaining a temperature of said semiconductor device in a range between 300-550° C. when exposing said surface areas of said transistor to said plasma-free ammonia and nitrogen containing atmosphere.

3. The method of claim 1, wherein exposing surface areas of a transistor of a semiconductor device to a plasma-free ammonia and nitrogen containing atmosphere comprises controlling a pressure of said atmosphere so as to be within a range from 1.8-3.0 Torr.

4. The method of claim 1, wherein exposing surface areas of a transistor of a semiconductor device to a plasma-free ammonia and nitrogen containing atmosphere comprises adjusting a flow rate ratio of ammonia to nitrogen so as to be within a range from 2/35 to 1.0.

5. The method of claim 4, further comprising supplying argon to said plasma-free ammonia and nitrogen containing atmosphere and controlling a flow rate ratio of said argon to said nitrogen so as to be within a range from 10/35 to 3.5.

6. The method of claim 1, wherein said surface areas are exposed to said plasma-free ammonia and nitrogen containing atmosphere for a time interval of at least 20 seconds.

7. The method of claim 1, wherein a thickness of said first strain-inducing material layer is less than a thickness of said second strain-inducing material layer.

8. The method of claim 7, wherein said thickness of said first strain-inducing material layer is 15 nm or less.

9. The method of claim 1, wherein said first and second strain-inducing material layers comprise silicon and nitrogen.

10. The method of claim 1, wherein the carrier gas is argon.

11. A method of forming a compressive bi-layer above a transistor, said method comprising:

removing oxygen-containing contaminants from a surface area above said transistor by establishing a chemically reactive atmosphere without supplying ionizing power to said chemically reactive atmosphere;

forming a first strain-inducing material layer on said surface area by establishing a first plasma atmosphere, said first strain-inducing material layer having a first internal stress level and a first thickness;

wherein the first plasma assisted deposition process comprises:

(a) providing an initial process atmosphere comprising an initial flow rate of carrier gas of zero or higher at a low frequency power of from 30-150 W for a deposition time of about 15 seconds, and, (b) performing:

(i) a first transition step comprising supplying a high frequency power of from about 60-160 W, the ratio of high frequency power to low frequency power being in the range of 1.5-2.5, and (ii) a second transition step comprising increasing the flow rate of carrier gas while maintaining said high frequency power for a time of 72-110 seconds; and forming a second strain-inducing material layer on said first strain-inducing material layer by establishing a second plasma atmosphere, said second plasma atmosphere differing from said first plasma atmosphere with respect to at least one process parameter, said second strain-inducing material layer having a second internal stress level and a second thickness, said second internal stress level being higher than said first internal stress level, said second thickness being greater than said first thickness.

12. The method of claim 11, wherein establishing said chemically reactive atmosphere comprises supplying ammonia gas (NH3) and nitrogen gas (N2) into a process environment used to contain said chemically reactive atmosphere.

13. The method of claim 12, wherein establishing said chemically reactive atmosphere comprises controlling a pressure so as to be in a range from 1.8-3.0 Torr.

14. The method of claim 11, wherein forming said second strain-inducing material layer comprises controlling said second internal stress level so as to be at 3.0 GPa or higher.

15. The method of claim 14, wherein forming said first strain-inducing material layer comprises controlling said first internal stress level so as to be in a range from 2.2-2.5GPa.

16. The method of claim 14, wherein establishing said second plasma atmosphere comprises controlling a pressure so as to be in a range from 1.8-3.0 Torr.

17. The method of claim 16, wherein establishing said second plasma atmosphere comprises supplying ammonia and silane (SiH4) as precursor gases and supplying argon and hydrogen as carrier and dilution gases, and wherein a ratio of flow rates of precursor gases to flow rates of carrier and dilution gases is in the range from 1/140 to 1/20.

18. The method of claim 11, further comprising performing three or more transition steps after forming said first strain-inducing material layer and prior to forming said second strain-inducing material layer, wherein a plasma atmosphere is maintained in each of said three or more transition steps.

19. The method of claim 11, wherein the carrier gas is argon.

* * * * *